(12) United States Patent
Zong

(10) Patent No.: US 11,904,352 B2
(45) Date of Patent: Feb. 20, 2024

(54) LOW DIELECTRIC CONSTANT FILM AND PREPARATION METHOD THEREOF

(71) Applicant: JIANGSU FAVORED NANOTECHNOLOGY CO., LTD., Jiangsu (CN)

(72) Inventor: Jian Zong, Jiangsu (CN)

(73) Assignee: JIANGSU FAVORED NANOTECHNOLOGY CO., LTD., Jiangsu (CN)

( * ) Notice: Subject to any disclaimer, the term of this patent is extended or adjusted under 35 U.S.C. 154(b) by 60 days.

(21) Appl. No.: 17/595,436

(22) PCT Filed: May 14, 2020

(86) PCT No.: PCT/CN2020/090119
§ 371 (c)(1),
(2) Date: Nov. 16, 2021

(87) PCT Pub. No.: WO2020/233480
PCT Pub. Date: Nov. 26, 2020

(65) Prior Publication Data
US 2022/0314271 A1  Oct. 6, 2022

(30) Foreign Application Priority Data

May 17, 2019 (CN) .......................... 201910413247.9

(51) Int. Cl.
*B05D 1/00* (2006.01)
*B05D 5/12* (2006.01)
(Continued)

(52) U.S. Cl.
CPC ................. *B05D 1/62* (2013.01); *B05D 5/12* (2013.01); *C23C 16/30* (2013.01);
(Continued)

(58) Field of Classification Search
CPC ........ B05D 1/62; B05D 5/12; B05D 2504/00; B05D 2506/10; B05D 2518/10; H01L 23/5329; C23C 16/30
(Continued)

(56) References Cited

U.S. PATENT DOCUMENTS 5,302,420 A  4/1994 Nguyen et al.
6,149,987 A  11/2000 Perng et al.
(Continued)

FOREIGN PATENT DOCUMENTS

CN  1367205 A  9/2002
CN  1389591 A  1/2003
(Continued)

OTHER PUBLICATIONS

International Search Report in PCT International Application No. PCT/CN2020/090119 dated Aug. 13, 2020.
(Continued)

*Primary Examiner* — Michael M. Bernshteyn
(74) *Attorney, Agent, or Firm* — Greenberg Traurig, LLP; Chinh H. Pham; Joshua Rudawitz

(57) ABSTRACT

Provided is a low dielectric constant film and a preparation method thereof, where epoxy alkanes, organosilicon compounds and fluorine-containing siloxane compounds are used as raw materials of the low dielectric constant film, and the low dielectric constant film is formed on a substrate surface by a plasma-enhanced chemical deposition method. Accordingly, a nanofilm with a low dielectric constant and excellent hydrophobicity is formed on the substrate surface.

36 Claims, 3 Drawing Sheets

(51) Int. Cl.
 *H01L 23/532* (2006.01)
 *C23C 16/30* (2006.01)
(52) U.S. Cl.
 CPC ...... *H01L 23/5329* (2013.01); *B05D 2504/00* (2013.01); *B05D 2506/10* (2013.01); *B05D 2518/10* (2013.01)
(58) Field of Classification Search
 USPC ......................................................... 428/447
 See application file for complete search history.

(56) References Cited

U.S. PATENT DOCUMENTS

| | | | |
|---|---|---|---|
| 6,852,651 B2 | 2/2005 | Shioya et al. | |
| 8,216,861 B1 | 7/2012 | Yim et al. | |
| 9,558,934 B2 | 1/2017 | Canaperi et al. | |
| 2002/0045359 A1 | 4/2002 | Todd | |
| 2002/0113316 A1 | 8/2002 | Shioya et al. | |
| 2003/0049460 A1* | 3/2003 | O'Neill | H01L 21/02203 |
| | | | 428/428 |
| 2004/0137757 A1 | 7/2004 | Li et al. | |
| 2004/0166240 A1 | 8/2004 | Rhee et al. | |
| 2004/0197474 A1 | 10/2004 | Vritis et al. | |
| 2005/0003213 A1 | 1/2005 | Ohdaira et al. | |
| 2005/0156285 A1 | 7/2005 | Gates et al. | |
| 2005/0181628 A1 | 8/2005 | Nobutoki et al. | |
| 2005/0245096 A1 | 11/2005 | Gates et al. | |
| 2006/0172531 A1 | 8/2006 | Lin et al. | |
| 2007/0172666 A1 | 7/2007 | Denes et al. | |
| 2011/0206857 A1* | 8/2011 | Yim | H01L 21/7681 |
| | | | 427/493 |
| 2013/0171546 A1 | 7/2013 | White et al. | |
| 2013/0330482 A1 | 12/2013 | Leu et al. | |
| 2014/0183087 A1* | 7/2014 | Weaver | B41J 2/17566 |
| | | | 427/230 |
| 2014/0183097 A1* | 7/2014 | LeRoy | B65D 81/05 |
| | | | 206/583 |
| 2016/0068960 A1 | 3/2016 | Jung et al. | |
| 2017/0245374 A1 | 8/2017 | Williams-Duncan | |

FOREIGN PATENT DOCUMENTS

| | | |
|---|---|---|
| CN | 1522462 A | 8/2004 |
| CN | 1645608 A | 7/2005 |
| CN | 1662676 A | 8/2005 |
| CN | 1698189 A | 11/2005 |
| CN | 1255573 C | 5/2006 |
| CN | 1815709 A | 8/2006 |
| CN | 1950932 A | 4/2007 |
| CN | 101065834 A | 10/2007 |
| CN | 101393865 A | 3/2009 |
| CN | 102317752 A | 1/2012 |
| CN | 102770580 A | 11/2012 |
| CN | 102822949 A | 12/2012 |
| CN | 103608898 A | 2/2014 |
| CN | 104968733 A | 10/2015 |
| CN | 105280816 A | 1/2016 |
| CN | 106291911 A | 1/2017 |
| CN | 106496529 A | 3/2017 |
| CN | 106958012 A | 7/2017 |
| CN | 109277269 A | 1/2019 |
| CN | 110129769 A | 8/2019 |
| CN | 110158052 A | 8/2019 |
| EP | 1150345 A2 | 10/2001 |
| EP | 1225194 A2 | 7/2002 |
| EP | 1617957 A2 | 1/2006 |
| EP | 3628756 A1 | 4/2020 |
| EP | 3674438 A1 | 7/2020 |
| GB | 2405404 A | 3/2005 |
| JP | H04345030 A | 12/1992 |
| JP | H06302704 A | 10/1994 |
| JP | 2002252228 A | 9/2002 |
| JP | 2016521296 A | 7/2016 |
| TW | I238471 B | 8/2005 |
| WO | 2003/095702 A2 | 11/2003 |
| WO | 2004083495 A2 | 9/2004 |
| WO | 2005004221 A2 | 1/2005 |
| WO | 2004083495 A3 | 2/2005 |
| WO | 2007061134 A1 | 5/2007 |
| WO | 2010096172 A1 | 8/2010 |
| WO | 2019037446 A1 | 2/2019 |

OTHER PUBLICATIONS

Partial Supplementary Search Report dated Jun. 29, 2023 in corresponding European Patent Application No. 20809129.8 (13 pages).

* cited by examiner

LOW DIELECTRIC CONSTANT FILM AND PREPARATION METHOD THEREOF

CROSS REFERENCE TO RELATED APPLICATIONS

This application is the national phase of International Application No. PCT/CN2020/090119, filed on 14 May 2020, which claims the benefit of and priority to Chinese Patent Application No. 201910413247.9, filed on 17 May 2019, the entire disclosure of each of which is incorporated herein by reference.

TECHNICAL FIELD

The disclosure relates to the field of manufacture of very large scale integrated circuits, in particular to a low dielectric constant film and a preparation method thereof.

BACKGROUND

Along with the release of global unified 5G standard, the development of the radio or microelectronic field becomes faster and faster, the performance requirement for the electronic chip rapidly increases, and the size of the integrated circuit is continuously reduced, that is to say, the number of devices integrated on the chip is bigger and bigger, the requirement on the integration level is higher and higher.

As the integration level of large-scale integrated circuits becomes higher and higher, the feature size of the device decreases gradually, leading to the increase of wire resistance and interwire and interlayer capacitance, causing increase of resistance-capacitance (RC) delay, thereby resulting in a series of problems such as signal transmission delay, noise interference increase and power loss increase, which greatly limits the high-speed performance of the device. One of the important methods for alleviating these problems is to reduce the dielectric constant (k) of the dielectric material.

In the field of radio communication technology, especially in the communication technology of GHz range, low loss materials with low dielectric constants have attracted more and more attention of people.

Generally, there are two ways to reduce the k-value of the material, one of which is by reducing the molecular polarizability, i.e., selecting or developing a material with low polarizability, such as, forming a low polarizability bond (for example, Si—C, Si—F, C—H, etc.) in the material; and the other of which is to reduce the number N of polarized molecules per unit volume, which could be achieved by introducing nanometer-sized pores into the material with the increase of the porosity, the dielectric constant decreasing relatively fast. Currently, there have been some studies in both aspects in the prior art.

In some existing studies, plasma enhanced chemical vapor deposition (PECVD) technology is used to prepare nanometer film with low dielectric constant. As an example, introduce one or more organosilicon compounds into a plasma enhanced chemical vapor deposition chamber, and introduce a pore-forming agent into the chamber. At a constant RF power react the one or more organosilicon compounds with the pore-forming agent, to deposit a low-k film on a substrate of the chamber. Furthermore, post-treat the low-k film, to substantially remove the pore-forming agent from the low-k film.

Although some organosilicon films having low dielectric constants have been developed, these low dielectric constant films suffer from some undesirable disadvantages. Inventors have discovered that there are some aspects of the prior art that need to be improved.

In one aspect, these materials require the addition of a pore-forming agent to form pores, after formation of the pores, the pore-forming agent is further removed, but the pore-forming agent typically could not be completely removed, sometimes even with relatively much residue.

On the other hand, these materials are formed by directly forming a porous film layer on a substrate, and the formation of the pores reduces the bonding strength of the film layer to the substrate, or the adhesion of the film layer to the substrate is relatively low, and the high porosity makes the dielectric constant lower, but the high porosity also makes the bonding strength lower, i.e., contradictions exist between these two aspects.

On the other hand, these materials have poor mechanical strength, poor corrosion resistance, so that the nanometer film layer is easily damaged in the subsequent semiconductor processing process.

On the other hand, the film layer is attached to the substrate by reaction of the pore-forming agent in the chamber by PECVD technology, but during forming, the uniformity of the film layer in different regions of the substrate can not be controlled at all, and the concentrations in different regions of the chamber are different, so that uneven distribution of the film layer on the substrate is easily caused.

On the other hand, the hydrophobicity of the existing low-dielectric constant nanometer film is poor, when deposited on a substrate surface, in a salt spray test, the surface of the substrate is easily corroded, so that it is not beneficial for the long-term use of the product, the requirement on the utilization environment is also relatively high.

The statements herein provide only background information relating to the present disclosure and do not necessarily constitute prior art.

SUMMARY

One advantage of the present disclosure is to provide a low dielectric constant film and a preparation method thereof. The low dielectric constant film comprises at least two layer structures, through the cooperation of the multi-layer structures the k value of the low dielectric constant film can be adjusted, and the bonding force and/or the mechanical property of the low dielectric constant film can be improved.

One advantage of the present disclosure is to provide a low dielectric constant film and a preparation method thereof. In one embodiment, a plasma enhanced chemical vapor deposition (PECVD) method is adopted to form an anticorrosive layer and a porous layer, the anticorrosive layer being attached to a substrate, to form a low dielectric constant (k) film with a relatively strong binding force with the substrate, and having a good corrosion resistance.

One advantage of the present disclosure is to provide a low dielectric constant film and a preparation method thereof, wherein in an inert gas atmosphere, a vinyl organosilicon monomer and a vinyl epoxy monomer are subjected to PECVD to form an anticorrosive layer.

One advantage of the present disclosure is to provide a low dielectric constant film and a method for preparing the same, wherein in one embodiment, the anticorrosive layer is a composite obtained by reaction of an epoxy alkane comprising unsaturated carbon-carbon double bonds and a siloxane or silane comprising unsaturated double bonds.

One advantage of the present disclosure is to provide a low dielectric constant film and a method for preparing the same, which place an anticorrosive layer between a porous layer and a substrate, such that the void fraction of the porous layer does not or hardly affect the bonding force between the low dielectric constant film and the substrate, and the k value could be made smaller by increasing the porosity.

One advantage of the present disclosure is to provide a low dielectric constant film and a method for preparing the same, which adopts a dynamic film coating method, so that the low dielectric constant film is more uniformly attached to a substrate, the difference of film coating at different positions of the substrate is reduced, the problem of non-uniform thickness caused by different concentrations of deposition in different regions of the substrate is solved.

One advantage of the present disclosure is to provide a low dielectric constant film and a method for preparing the same, which, in a single atmosphere or a mixed atmosphere of oxygen, nitrogen/hydrogen, perform PECVD on a single atmosphere or a mixed atmosphere of organosilane, organosiloxane to obtain a porous layer.

One advantage of the present disclosure is to provide a low dielectric constant film and a method for preparing the same, which forms a fluorosilicone polymer on the surface layer, to further reduce the k value of the low dielectric constant film.

One advantage of the present disclosure is to provide a low dielectric constant film and a method for preparing the same, which on a surface layer forms an organic fluorosilicone comprising an aromatic group, utilizes a rigid structure of the aromatic group, and improves the mechanical property of the low dielectric constant film.

One advantage of the present disclosure is to provide a low dielectric constant film and a method for preparing the same. The low dielectric constant film has a surface with a low surface energy fluorosilicone polymer, having a super-hydrophobic property, and having a large static contact angle when water is on the surface.

One advantage of the present disclosure is to provide a low dielectric constant film and a method for preparing the same. When the low dielectric constant film is formed, alternately deposit an organosilicon nanometer film and the organosilicon/oxygen. After the organosilicon layer is formed, oxygen is introduced. The hydrocarbon part of the organosilicon layer reacts with the oxygen to form an irregular rough surface. Then SiOCNH is deposited on the surface, so that macropores with higher specific surface area are facilitated to be formed, and the alternating structure facilitates the enhancement of the adhesive force of the low-dielectric constant film and the substrate.

One advantage of the present disclosure is to provide a low dielectric constant film and a method for preparing the same, which could by adjusting the content of fluorine-containing aromatic groups adjust the dielectric properties and mechanical properties of the low dielectric constant film.

One advantage of the present disclosure is to provide a low dielectric constant film and a method for preparing the same. In one embodiment, by a PECVD process a two-layer structure comprising a porous layer and a fluorine-containing layer is formed, so that while the k value is reduced, the hydrophobic performance of the low dielectric constant film is improved, the corrosion resistance of the deposited substrate is improved.

One advantage of the present disclosure is to provide a low dielectric constant film and a method for preparing the same. In one embodiment, by a PECVD method a two-layer structure composed of an anticorrosive layer and a porous layer is formed, which while reducing the k value, enhances the bonding force and adhesion between the low dielectric constant film and the substrate.

One advantage of the present disclosure is to provide a low dielectric constant film and a method for preparing the same. In one embodiment, by adopting a PECVD process a three-layer structure comprising an anticorrosive layer, a porous layer and a fluorine-containing layer is formed, through alternate arrangement of different layers, the dielectric property, the mechanical property and the hydrophobicity of the low dielectric constant film are integrally improved, and the alternate arrangement is beneficial to forming the porous layer with large pore volume.

One advantage of the present disclosure is to provide a low dielectric constant film and a method for preparing the same, which do not require a pore-forming agent to form a pore structure, thus do not need high temperature annealing to remove the pore-forming agent.

To achieve at least one of the above objects, one aspect of the present disclosure provides a low dielectric constant film, using an epoxy alkane, an organosilicon compound, and a fluorine-containing siloxane compound as raw materials, formed on a substrate surface by plasma enhanced chemical vapor deposition process.

According to at least one embodiment of the present disclosure, the low dielectric constant film includes an anticorrosive layer, formed of an epoxy alkane compound A containing unsaturated double bonds and a siloxane or silane compound B containing unsaturated double bonds by plasma enhanced chemical vapor deposition on a substrate surface.

According to at least one embodiment of the present disclosure, the low dielectric constant film comprises a porous layer. The porous layer is formed of an organosilane and/or organosiloxane compound C and an alkane compound and/or benzene compound E by plasma enhanced chemical vapor deposition.

According to at least one embodiment of the present disclosure, the low dielectric constant film includes a porous layer. The porous layer is formed of a compound C and a compound E by plasma enhanced chemical vapor deposition, the compound C comprising an organosilicon compound, the compound E comprising an alkane compound and a benzene compound.

According to at least one embodiment of the present disclosure, the low dielectric constant film includes a porous layer. The porous layer is formed of a compound C and a compound E by plasma enhanced chemical vapor deposition, the compound C comprising an organosilicon compound, the compound E comprising an alkane compound.

According to at least one embodiment of the present disclosure, the low dielectric constant film includes a porous layer. The porous layer is formed of a compound C and a compound E by plasma enhanced chemical vapor deposition, the compound C comprising an organosilicon compound, the compound E comprising a benzene compound.

According to at least one embodiment of the present disclosure, the low dielectric constant film includes a fluorine-containing layer. The fluorine-containing layer is formed of an aromatic fluorosilane D by plasma enhanced chemical vapor deposition.

According to at least one embodiment of the present disclosure, the low dielectric constant film has a bottom layer formed of a vinyl epoxy compound and a vinyl organosilicon compound by plasma enhanced chemical vapor deposition on a substrate surface.

According to at least one embodiment of the present disclosure, the compound A includes one or more selected from a group consisting of: vinyl ethylene oxide, glycidyl methacrylate, allyl glycidyl ether, 1,2-epoxy-4-vinylcyclohexane, 2,3-epoxypropyldimethylvinylsilane, and 2,3-epoxypropyldichlorovinylsilane.

According to at least one embodiment of the present disclosure, the compound B includes one or more selected from a group consisting of: allyltrimethoxysilane, vinyltriethoxysilane, trimethylvinylsilane, 3-butenyltrimethylsilane, vinyltributylketoxime silane, tetramethyldivinyldisiloxane, tetramethyltetravinylcyclotetrasiloxane, 1,2,2-trifluorovinyltriphenylsilane, dimethylmethoxyvinylsilane, and 4-styryltrimethoxysilane.

According to at least one embodiment of the present disclosure, the compound C includes an organosiloxane.

According to at least one embodiment of the present disclosure, the compound C includes an organosilane.

According to at least one embodiment of the present disclosure, the compound C includes one or more selected from a group consisting of: γ-glycidyloxypropyltrimethoxysilane; D4H cyclotetrasiloxane, hexamethylcyclotrisiloxane, tris-(trimethoxysilane) ylphenylsilane, t-butyldimethylchlorosilane, phenylethynyltrimethylsilane, biphenylvinyltrimethylsilane, octaphenylcyclotetrasiloxane, triphenylhydroxysilane, trifluoropropylmethylcyclotrisiloxane, 2,2,4,4-tetramethyl-6,6,8,8-tetraphenylcyclotetrasoxane, tetramethyltetravinylcyclotetrasiloxane, 3-glycidyl ether oxypropyltriethoxysilane, tetramethyldivinyldisiloxane, tetraethyldisiloxane, hexamethyldisiloxane, phenyltris (trimethylsiloxy) silane, trimethylphenylsilane, hexamethyldisilazane, allyltriphenylsilane, phenyltrichlorosilane, phenyltrifluorosilane, phenyltriethoxysilane, phenyltrimethoxysilane, methylphenyldimethoxysilane, dimethoxymethylphenylsilane, 1, 3-dichlorotetraphenyldisiloxane, phenylvinyltrimethylsilane, naphthylvinyltrimethylsilane, diphenyldihydroxysilane, Octamethylcyclotetrasiloxane, hexaphenylcyclotrisiloxane, decamethylcyclopentasiloxane, phenyltrichlorosilane, methylphenyldichlorosilane, phenyldimethylchlorosilane, methylphenylcyclotrisiloxane, trimethoxymethylsilane, trifluoropropylmethylcyclotrisiloxane, tris-(triethoxysilane) ylphenylsilane, perfluorooctylethylpentafluorophenyldimethoxysilane, and tris-(triethylsilane) ylphenylsilane.

According to at least one embodiment of the present disclosure, the compound E includes one or more selected from a group consisting of: cyclobutane, cyclopentane, cyclohexane, benzene, toluene, and p-xylene.

According to at least one embodiment of the present disclosure, the compound D includes one or more selected from a group consisting of: pentafluorophenyltriethoxysilane, pentafluorophenyltrimethoxysilane, pentafluorophenyltrichlorosilane, pentafluorophenyldimethylchlorosilane, perfluorooctyl ethyl pentafluorophenyl dichlorosilane, pentafluorodichlorophenylperfluorohexylethylsilane, perfluorooctyldichlorophenylsilane, perfluorooctyldiethoxyphenylsilane, perfluorooctylethylpentafluorophenyldimethoxysilane, perfluorobutylethylpentafluorophenyldichlorosilane, and perfluorobutylethylpentafluorophenyldimethoxy silane.

According to at least one embodiment of the present disclosure, during vapor deposition, an auxiliary gas is introduced for reaction, the auxiliary gas including one or more selected from a group consisting of He and Ar.

According to at least one embodiment of the disclosure, during a vapor deposition process an auxiliary gas is introduced for reaction, the auxiliary gas including one or more selected from a group consisting of nitrogen/hydrogen, ammonia, oxygen, and hydrocarbon organic matters.

According to at least one embodiment of the present disclosure, a dielectric constant values of the low dielectric constant film ranges from 2.1 to 2.2, 2.2 to 2.3, 2.4 to 2.5, 2.5 to 2.6, or 2.6 to 2.7.

According to at least one embodiment of the present disclosure, the low dielectric constant film has a Young's modulus ranging from 10 GPa to 11 GPa, 11 GPa to 12 GPa, 12 GPa to 13 GPa, 23 GPa to 24 GPa, 26 GPa to 27 GPa, 27 GPa to 28 GPa, 29 GPa to 30 GPa, 31 GPa to 32 GPa, or 33 GPa to 34 GPa.

According to at least one embodiment of the present disclosure, the low dielectric constant film has a static contact angle ranging from 110° to 115°, from 115° to 120°, from 120° to 125°, from 125° to 130°, from 130° to 135°, from 135° to 140°, from 140° to 145°, from 145° to 150°, or from 150° to 155°.

According to at least one embodiment of the present disclosure, the low dielectric constant film has a thickness ranging from 10 to 2000 nm.

Another aspect of the present disclosure provides a low dielectric constant film, comprising: a porous layer, the porous layer being formed of an organosilane and/or organosiloxane compound C and an alkane compound and/or benzene compound E by plasma enhanced chemical vapor deposition; and a fluorine-containing layer, the fluorine-containing layer being formed of an aromatic fluorosilane D by plasma enhanced chemical vapor deposition.

According to at least one embodiment of the present disclosure, the porous layer of the low dielectric constant film is deposited directly on a surface of a substrate, and the fluorine-containing layer is deposited on a surface of the porous layer.

According to at least one embodiment of the present disclosure, the low dielectric constant film includes an anticorrosive layer. The anticorrosive layer is formed of epoxy alkane compound A containing unsaturated double bond and siloxane or silane compound B containing unsaturated double bond by plasma enhanced chemical vapor deposition on a substrate surface. The porous layer is deposited on the anticorrosive layer.

Another aspect of the present disclosure provides a method for preparing a low dielectric constant film, comprising the steps of:
  (A) vapor depositing an anticorrosive layer on a surface of a substrate; and
  (B) vapor depositing a porous layer.

According to at least one embodiment of the present disclosure, the step (A) of the method for preparing the low dielectric constant film comprises:
  (A1) introducing a vinyl epoxy alkane compound A and a vinyl organosilicon compound B into a chamber of a reactor;
  (A2) introducing an inert gas into the chamber of the reactor; and
  (A3) at a predetermined power, forming the anticorrosive layer on the surface of the substrate by deposition through reaction of the compound A and the compound B.

According to at least one embodiment of the present disclosure, the step (B) of the method for preparing a low dielectric constant film comprises:

(B1) introducing a compound C and a compound E, wherein the compound C comprises an organosilicon compound, the compound E comprises an alkane compound and a benzene compound;
(B2) introducing a gas, wherein the gas includes one or more selected from a group consisting of a combination of nitrogen and hydrogen, and ammonia;
(B3) introducing oxygen; and
(B4) at a predetermined power, forming the porous layer by vapor deposition through reaction of the compound C and the compound E.

According to at least one embodiment of the present disclosure, the step (B) of the method for preparing a low dielectric constant film comprises:
(B1) introducing a compound C and a compound E, wherein the compound C comprises an organosilicon compound, and the compound E comprises an alkane compound;
(B2) introducing a gas, wherein the gas includes one or more selected from a group consisting of a combination of nitrogen and hydrogen, and ammonia;
(B3) introducing oxygen; and
(B4) at a predetermined power, forming the porous layer by vapor deposition through reaction of the compound C and the compound E.

According to at least one embodiment of the present disclosure, the step (B) of the method for preparing a low dielectric constant film comprises:
(B1) introducing a compound C and a compound E, wherein the compound C comprises an organosilicon compound, the compound E comprises a benzene compound;
(B2) introducing a gas, wherein the gas includes one or more selected from a group consisting of a combination of nitrogen and hydrogen, and ammonia;
(B3) introducing oxygen; and
(B4) at a predetermined power, forming the porous layer by vapor deposition through reaction of the compound C and the compound E.

According to at least one embodiment of the disclosure, wherein oxygen is introduced in an intermittent manner.

According to at least one embodiment of the present disclosure, the method for preparing the low dielectric constant film further comprises a step (C): vapor depositing a fluorine-containing layer to the porous layer.

According to at least one embodiment of the present disclosure, the step (C) of the method for preparing the low dielectric constant film comprises:
(C1) introducing an inert gas;
(C2) introducing an aromatic fluorosilane D; and
(C3) at a predetermined power, forming the fluorine-containing layer by vapor deposition through reaction of the aromatic fluorosilane D.

According to at least one embodiment of the present disclosure, the method of preparing a low dielectric constant film further comprises a step of: cleaning the substrate surface.

According to at least one embodiment of the present disclosure, the method of preparing the low dielectric constant film further comprises a step of: operating the substrate, such that the substrate moves in the chamber.

DETAILED DESCRIPTION

Figure 1:
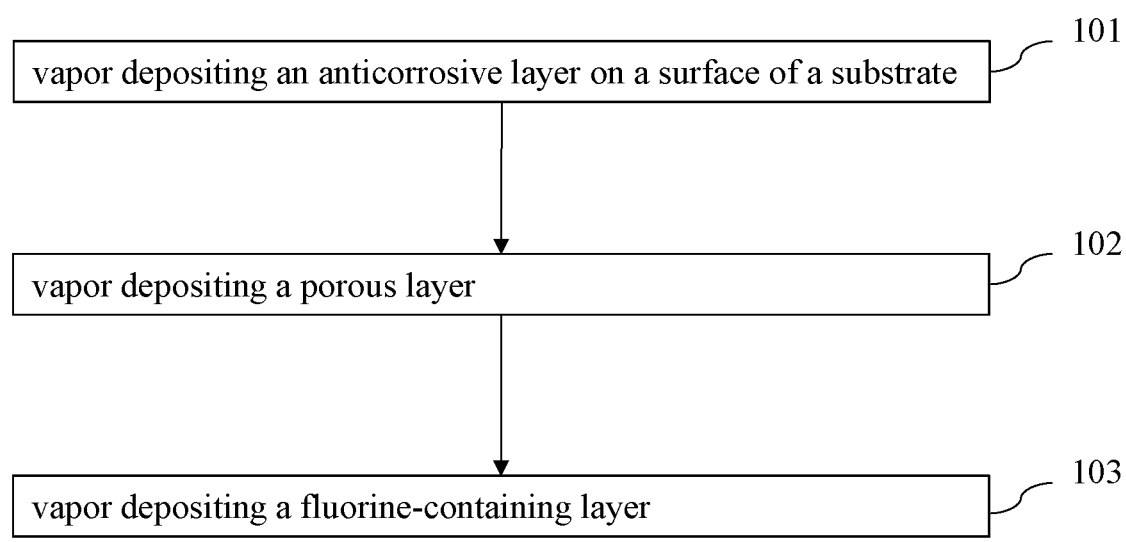
FIG. 1 schematically illustrates a block diagram of a process for preparing a low dielectric constant film according to one embodiment of the present disclosure.

The following description serves to disclose the disclosure to enable those skilled in the art to practice the present disclosure. The preferred embodiments in the following description are only examples. Those skilled in the art may think of other obvious variations. The basic principles of the present disclosure as defined in the following description may be applied to other embodiments, variations, modifications, equivalents, and other technical solutions without departing from the spirit and scope of the present disclosure.

Those skilled in the art will appreciate that, in the disclosure of the present disclosure, the terms "longitudinal", "transverse", "upper", "lower", "front", "rear", "left", "right", "vertical", "horizontal", "top", "bottom", "inner", "outer" and the like indicate azimuth or positional relationships based on the azimuth or positional relationships shown in the drawings. It is only intended to facilitate the description and simplify the description, and not to indicate or imply that the apparatus or element referred to must have a particular orientation, be constructed and operated in a particular orientation, so the above-mentioned terms are not to be construed to limit the present disclosure.

It will be appreciated that the term "a", "an", or "one" is to be understood as "at least one" or "one or more", i.e., in one embodiment, the number of one element may be one and in another embodiment the number of one element may be multiple, and that the term "a", "an", or "one" is not to be construed to limit the number.

The present disclosure provides a low dielectric constant film and a preparation method thereof. The low dielectric constant film comprises silicon, oxygen and carbon. Preferably, the low dielectric constant film comprises silicon, oxygen, carbon and fluorine. The low dielectric constant film has nanometer-sized pores.

The low dielectric constant film has good dielectric properties. The low dielectric constant film has k value of less than 2.8. For example, preferably, the low dielectric constant film has a k value in a range of 1.9 to 2.7. For example, the low dielectric constant film has a k value in a range of 2.0 to 2.7. For example, the low dielectric constant film has a k value in a range of 2.1 to 2.2, 2.2 to 2.3, 2.4 to 2.5, 2.5 to 2.6, or 2.6 to 2.7.

The low dielectric constant film has relatively good mechanical properties, the Young's modulus of the low dielectric constant film is greater than 10 GPa. Preferably, the Young's modulus of the low dielectric constant film ranges from 10 GPa to 41 GPa. For example, the Young's modulus ranges from 10 GPa to 11 GPa, 11 GPa to 12 GPa, 12 GPa to 13 GPa, 23 GPa to 24 GPa, 26 GPa to 27 GPa, 27 GPa to 28 GPa, 29 GPa to 30 GPa, 31 GPa to 32 GPa or 33 GPa to 34 GPa. The hardness of the low dielectric constant film is greater than 1.5 GPa. Preferably, the hardness of the low dielectric constant film ranges from 1.6 GPa to 2.9 GPa. For example, the hardness ranges from 1.62 GPa to 2.79 GPa.

The low dielectric constant film has excellent hydrophobicity. A static contact angle of water adhered to the low dielectric constant film is greater than 110°. For example, the static contact angle is greater than 120°. For example, the static contact angle is greater than 140°. For example, a range of the static contact angles is: 110°-115°, 115°-120°, 120°-125°, 125°-130°, 130°-135°, 135°-140°, 140°-145°, 145°-150° or 150°-155° or 155°-160°. Thus, the low dielectric constant film has good corrosion resistance. For example, when the low dielectric constant film is deposited on a metal iron surface through a salt spray test for 90 hours, the iron sheet is not corroded or only has a small number of corrosion points. Preferably, in some embodiments, the low dielectric constant film is deposited on the metal iron surface through a salt spray test for 96 hours, the iron sheet is not corroded.

The low dielectric constant film is a nanometer film having a thickness ranging from, for example but not limited to, 10 nm to 2000 nm.

According to this embodiment of the present disclosure, the low dielectric constant film is formed by a plasma enhanced chemical vapor deposition (PECVD) process on a substrate surface. That is to say, the raw material for forming the low dielectric constant film is deposited by a PECVD process on the substrate surface, to form on the surface of the substrate the low dielectric constant film. For example, but not limited to, the low dielectric constant film is deposited on the surface of a circuit board of a large-scale integrated circuit, thereby improving the RC delay phenomenon of the large-scale integrated circuit.

The plasma enhanced chemical vapor deposition (PECVD) method generates plasma through glow discharge. The discharge method may comprise one selected from a group consisting of microwave discharge, radio frequency discharge, ultraviolet discharge, and electric spark discharge.

For example, the low dielectric constant film uses an epoxy alkane, an organosilicon compound and a fluorine-containing siloxane compound as raw materials, to be formed by a plasma enhanced chemical vapor deposition process on a substrate surface.

The low dielectric constant film has a multilayer structure. For example, the low dielectric constant film includes an anticorrosive layer, a porous layer and a fluorine-containing layer. The anticorrosive layer, the porous layer and the fluorine-containing layer are formed by a PECVD process on the substrate surface.

According to one embodiment of the present disclosure, the anticorrosive layer is composed of an organosilicon polymer. Further, the anticorrosive layer is composed of a nanometer scale organosilicon polymer. For example, the organosilicon polymer or a raw material for forming the organosilicon polymer is deposited through PECVD on the surface of the substrate, to form the anticorrosive layer of the low-dielectric constant film, or the first layer of the low-dielectric constant film.

For example, the anticorrosive layer is a composite obtained by reaction of an epoxy alkane compound A comprising an unsaturated carbon-carbon double bond with a siloxane or silane compound B comprising an unsaturated double bond.

For example, the anticorrosive layer may be formed from reaction of a vinyl epoxy alkane and a vinyl organosilane or vinyl organosiloxane, under the condition of preset power and preset temperature of a reactor, by PECVD, deposition on the substrate surface. Vinyl epoxy alkane is an organic matter comprising an epoxy group and a carbon-carbon double bond, and at normal pressure has a boiling point of not higher than 400° C. Vinyl silane or vinyl siloxane comprises linear, cyclic silanes, siloxanes comprising carbon-carbon unsaturated double bonds, and at normal pressure has a boiling point of not higher than 300° C.

For example, the compound A includes one or more selected from a group consisting of: vinyl ethylene oxide, glycidyl methacrylate, allyl glycidyl ether, 1,2-epoxy-4-vinylcyclohexane, 2,3-epoxypropyldimethylvinylsilane, and 2,3-epoxypropyldichlorovinylsilane.

For example, the compound B includes one or more selected from a group consisting of: allyltrimethoxysilane, vinyltriethoxysilane, trimethylvinylsilane, 3-butenyltrimethylsilane, vinyltributylketoxime silane, tetramethyldivinyldisiloxane, tetramethyltetravinylcyclotetrasiloxane, 1,2,2-trifluorovinyltriphenylsilane, dimethylmethoxyvinylsilane, and 4-styryltrimethoxysilane.

For example, during the process of preparing the anticorrosive layer, there is a need to introduce an auxiliary gas for vapor deposition. The auxiliary gas is exemplified by, but not limited to, inert gases He, Ar, or a mixture of He and Ar.

In one embodiment, the anticorrosive layer is formed of a composite of an epoxy resin and an organosilicon. For example, an epoxy resin material and an organosilicon material are deposited by PECVD on the surface of the substrate to form a polymer layer having corrosion resistance. For example, using single atmosphere or mixed atmosphere of vinyl epoxy alkane, vinyl siloxane, vinyl silane as reaction source, in a low-temperature low-pressure plasma environment vapor deposit to obtain organosilicon polymer composite nanometer film layer, i.e., the anticorrosive layer.

In one embodiment, the porous layer is an organosilicon having a plurality of pores, and the porosity of the porous layer adjusts the k value of the low dielectric constant film. For example, an organosilicon material is deposited on the surface of the substrate by PECVD to form an organosilicon nanometer layer having a porous structure, thereby forming the porous layer of the low dielectric constant nanometer film, alternatively, the second layer of the low dielectric constant film. For example, During the preparation process of the porous layer, it needs to introduce an auxiliary gas to form the porous layer, for example, in a single atmosphere or a mixed atmosphere of nitrogen/hydrogen, ammonia, oxygen, hydrocarbon organic matter, vapor deposit a single or mixed atmosphere comprising organosilicon and organosiloxane to obtain a porous SiOCNH nanometer film layer, i.e., the porous layer of the low dielectric constant film. More specifically, hydrocarbon organic matter in the auxiliary gas are mainly branched alkanes, cycloalkanes, aromatic hydrocarbons having 12 or less carbon atoms.

In one embodiment, the porous layer may be formed by reaction of a compound C with a compound E. The compound C is an organosilicon compound, e.g., an organosiloxane, or an organosilane. The compound E may be an alkane compound, or a benzene compound.

In one embodiment, the porous layer may be formed of reaction of an organosilane and/or organosiloxane compound C and an alkane compound and/or a benzene compound E, under the condition of preset power and preset temperature of a reactor, by means of PECVD, deposition on the surface of the anticorrosive layer. The organosilicon compound C includes branched chain, cyclic silane or siloxane, and is liquid or gas with a boiling point of less than 350° C. at normal pressure.

For example, the compound C is one or more selected from a group consisted of: γ-glycidyloxypropyltrimethoxysilane; D4H cyclotetrasiloxane, hexamethylcyclotrisiloxane, tris-(trimethoxysilane) ylphenylsilane, t-butyldimethylchlorosilane, phenylethynyltrimethylsilane, biphenylvinyltrimethylsilane, octaphenylcyclotetrasiloxane, triphenylhydroxysilane, trifluoropropylmethylcyclotrisiloxane, 2,2,4,4-tetramethyl-6,6,8,8-tetraphenylcyclotetrasiloxane, tetramethyltetravinylcyclotetrasiloxane, 3-glycidyl ether oxypropyltriethoxysilane, tetramethyldivinyldisiloxane, tetraethyldisiloxane, hexamethyldisoxane, phenyltris (trimethylsiloxy) silane, trimethylphenylsilane, hexamethyldisilazane, allyltriphenylsilane, phenyltrichlorosilane, phenyltrifluorosilane, phenyltriethoxysilane, phenyltrimethoxysilane, methylphenyldimethoxysilane, dimethoxymethylphenylsilane, 1,3-dichlorotetraphenyldisiloxane, phenylvinyltrimethylsilane, naphthylvinyltrimethylsilane, diphenyldihydroxysilane, Octamethylcyclotetrasiloxane, hexaphenylcyclotrisiloxane, decamethylcyclopentasiloxane, phenyltrichlorosilane, methylphenyldichlorosilane, phenyldimethylchlorosilane, methylphenylcyclotrisiloxane, trimethoxymethylsilane, trifluoropropylmethylcyclotrisiloxane, tris-(triethoxysilane) ylphenylsilane, perfluorooctylethylpentafluorophenyldimethoxysilane, and tris-(triethylsilane) ylphenylsilane.

For example, the compound E is one or more selected from a group consisting of: cyclobutane, cyclopentane, cyclohexane, benzene, toluene, and p-xylene.

In one embodiment, when manufacturing the low dielectric constant film, after depositing on the substrate by the PECVD method the anticorrosive layer, continue in the same reaction chamber, by the PECVD method to deposit the porous layer.

In one embodiment, when the low dielectric constant film is manufactured, after forming the anticorrosive layer, in a nitrogen/hydrogen and/or ammonia atmosphere, at a predetermined frequency oxygen is intermittently introduced, the porous layer is obtained from reaction of the compound C and the compound E by deposition.

Notably, according to one embodiment of the present disclosure, the anticorrosive layer is disposed between the porous layer and the substrate, such that the porosity of the porous layer does not or hardly affect the bonding force of the low dielectric constant film to the substrate, and the k value could be made smaller by increasing the porosity.

In one embodiment, the fluorine-containing layer is a fluorosilicone polymer. Further, the fluorine-containing layer is an organofluorosilicon comprising an aromatic group with a low dielectric constant. By utilizing the rigid structure of the aromatic group, the mechanical properties of the fluorine-containing layer are improved. For example, in one embodiment, the fluorine-containing layer is an organofluorosilicon comprising a phenyl. The steric hindrance of the benzene ring is relatively large, so that the roughness of the low dielectric constant film could be adjusted.

In the preparation process of the low dielectric constant film, the fluorine-containing phenyl content in the low dielectric constant film could be changed by changing the ratio of the amounts of the fluorine-containing aromatic organosilane and the cyclosiloxane. By adjusting the content of fluorine-containing aromatic group, the electrical properties and mechanical properties of the low dielectric constant film could be adjusted and the k value of the low dielectric constant film could be further reduced.

In one embodiment, under an inert gas atmosphere, a fluorosilicon layer comprising an aromatic structure, or the third layer of the low dielectric constant film, is deposited on the surface of the porous layer.

In one implementation, the fluorine-containing layer is formed of reaction of an aromatic fluorosilane D, by means of PECVD, through deposition on the surface of the porous layer. The fluorine-containing layer is low in the surface energy and excellent in the hydrophobic performance. The static contact angle of water on the surface of the fluorine-containing layer is relatively large. An organic fluorosilicone comprising aromatic groups is formed on the surface of the low-dielectric constant film. By means of the rigid structure of the aromatic groups, the mechanical performance of the low-dielectric constant film is improved.

For example, the compound D includes one or more selected from a group consisting of: pentafluorophenyltriethoxysilane, pentafluorophenyltrimethoxysilane, pentafluorophenyltrichlorosilane, pentafluorophenyldimethylchlorosilane, perfluorooctyl ethyl pentafluorophenyl dichlorosilane, pentafluorodichlorophenylperfluorohexylethylsilane, perfluorooctyldichlorophenylsilane, perfluorooctyldiethoxyphenylsilane, perfluorooctylethylpentafluorophenyldimethoxysilane, perfluorobutylethylpentafluorophenyldichlorosilane, and perfluorobutylethylpentafluorophenyldimethoxysilane.

When the low dielectric constant film is manufactured, after forming the porous layer, at a predetermined power, continue to introduce a gaseous compound D into the same reaction chamber, to deposit for a predetermined time, to obtain a surface layer of the low dielectric constant film.

In one embodiment, on the surface of the low dielectric constant film by means of plasma enhanced chemical vapor deposition technology, deposit fluorine-containing aromatic silane in the holes of the porous three-dimensional organosilicon coating and on the surface of the coating. The fluorine-containing aromatic silane has a relatively low dielectric constant, and the steric hindrance of benzene ring is relatively large, so that the roughness of the nanometer coating could be regulated. Therefore, in the preparation process of the low dielectric constant material film, the content of the fluorine-containing phenyl in the molecule could be changed by changing the quantity ratio of fluorine-containing aromatic organosilicon monomer to cyclosiloxane. The electrical and other properties of the low dielectric constant material film are adjusted by adjusting the content of the fluorine-containing aromatic groups in the molecules.

Notably, the low dielectric constant film of the present disclosure is composed of a multilayer structure, such as including two or three or more layers. In one embodiment of the present disclosure, the low dielectric constant film is composed of a two-layered structure. For example, in one embodiment, the low dielectric constant film is composed of the anticorrosive layer and the porous layer to form a two-layered structure. In manufacturing, on the substrate surface firstly chemical vapor deposit the compound A and the compound B to form the anticorrosive layer, then continue to chemical vapor deposit the compound C and the compound E to form the porous layer. The anticorrosive layer is the bottom layer, and the porous layer is the surface layer. The low dielectric constant film of two-layer structure is composed of the anticorrosive layer and the porous layer, while reducing the k value, it could raise the binding force and adhesion between the low dielectric constant film and the substrate.

For example, in one embodiment, the low dielectric constant film is composed of the porous layer and the fluorine-containing layer to form a two-layer structure. In manufacturing, on the substrate surface firstly chemical vapor deposit a compound C and a compound E to form the porous layer, then continue to chemical vapor deposit the compound D to form the fluorine-containing layer. The porous layer is the bottom layer, the fluorine-containing layer is the surface layer. The low-dielectric constant film with a two-layer structure is composed of the porous layer and the fluorine-containing layer, while reducing the k value, the hydrophobic performance of the low-dielectric constant film could be improved, and so could the corrosion resistance of the deposited substrate.

For example, in one embodiment, the low dielectric constant film is composed of the anticorrosive layer, the porous layer and the fluorine-containing layer to form a three-layer structure. In manufacturing, on the substrate surface firstly chemical vapor deposit a compound A and a compound B to form the anticorrosive layer, then continue to chemical vapor deposit a compound C and a compound E to form the porous layer, and continue to chemical vapor deposit a compound D on the porous layer to form the fluorine-containing layer. The anticorrosive layer is the bottom layer, the porous layer is the intermediate layer, the fluorine-containing layer is the surface layer. The low dielectric constant film with a three-layer structure composed of the anticorrosive layer, the porous layer and the fluorine-containing layer, through the alternate arrangement of different layers, integrally improves the dielectric property, the mechanical property and the hydrophobicity of the low dielectric constant film, and the alternate arrangement is favorable for forming the porous layer with large pore volumes.

Notably, the pore structure in the low dielectric constant nanometer film has relatively big influence on the reduction of the dielectric constant, while also influencing the mechanical property and hydrophobicity. For example, as the porosity increases, the k value may be significantly reduced. However, the increase in porosity could also affect the performance of the substrate by reduction in machinery strength and the reduction in binding force, and when there are many surface pores, the hydrophobicity is reduced. The reduction of the dielectric constant of the nanometer film depends on the total air volume after the introduction of the porous material, which includes three aspects: (1) the void volume due to the incomplete filling of the porous SiOCNH pore channels; (2) voids generated by the random arrangement of fluorosilicone chains; (3) a free volume produced by the addition of porous SiOCNH. According to embodiments of the present disclosure, the low dielectric constant film has a two or three-layered structure including the anticorrosive layer, the porous layer and/or the fluorine-containing layer, so as to reduce the dielectric constant and balance between mechanical properties and hydrophobicity.

According to at least one embodiment of the instant disclosure, when the low dielectric constant film is formed, alternately depositing an organosilicon nanometer film and the organosilicon/oxygen, oxygen is introduced after the organosilicon layer is formed, the hydrocarbon part of the organosilicon layer reacts with the oxygen to form an irregular rough surface, and then SiOCNH is deposited on the surface, so that macropores with relatively high specific surface area are facilitated to be formed, and the alternating structure facilitates the enhancement of the adhesive force of the low-dielectric constant film and the substrate.

The three-dimensional network structure of the low dielectric constant film is formed by multiple times of plasma enhanced chemical vapor deposition. It does not require the formation of pores with the aid of a pore-forming agent. It does not require a high temperature annealing process to treat. One embodiment of the present disclosure copolymerizes a cyclic organosilicon monomer with a bulk monomer having a relatively big steric hindrance. Such copolymerization is carried out in a plasma atmosphere of $O_2$. By controlling the quantity of $O_2$, the Si—O bond is bonded to the hydrocarbon, so that the organosilicon nanometer coating of a low-dielectric constant and with a three-dimensional structure could be controllably prepared.

Figure 2:
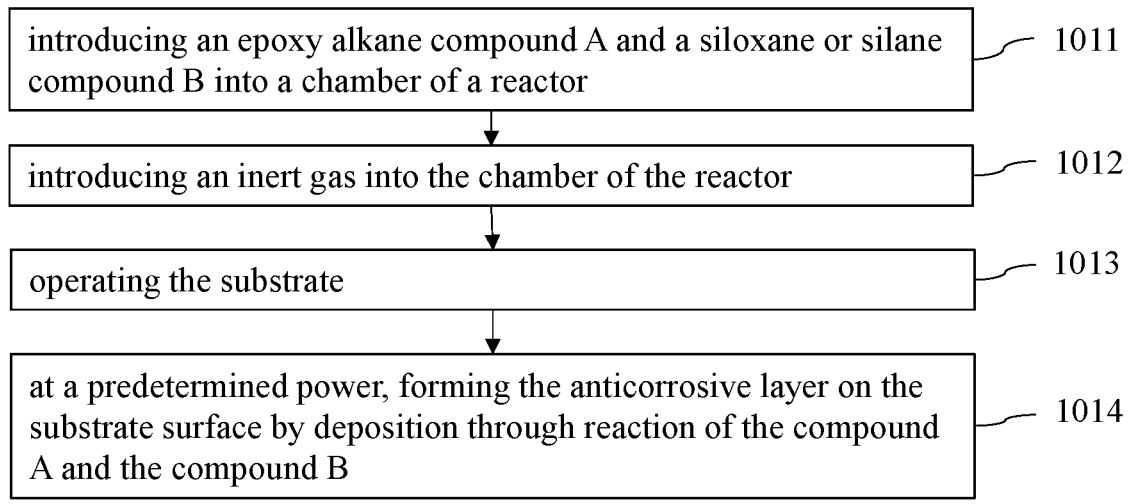
FIG. 2 schematically illustrates a block diagram of a process for forming an anticorrosive layer of a low dielectric constant film according to one embodiment of the present disclosure.
Figure 3:
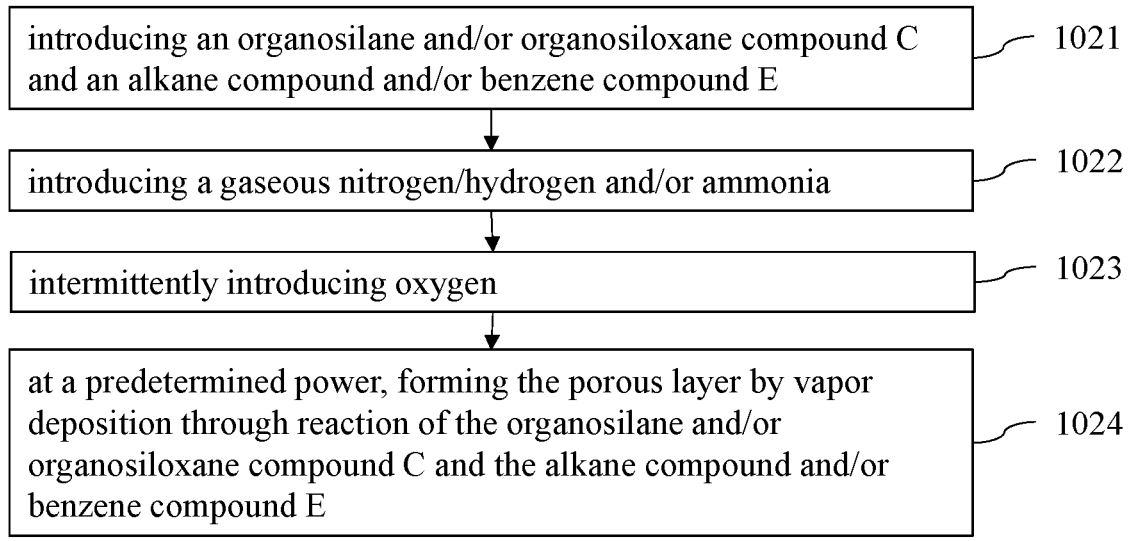
FIG. 3 schematically illustrates a block diagram of a process for forming a porous layer of a low dielectric constant film according to one embodiment of the present disclosure.
Figure 4:
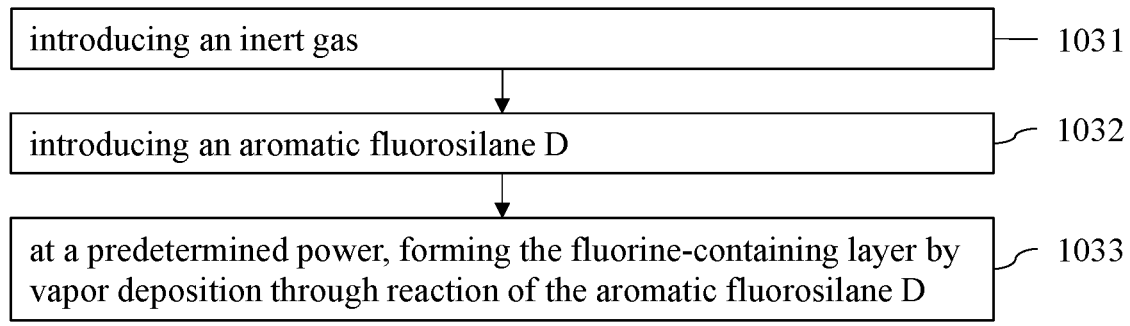
FIG. 4 schematically illustrates a block diagram of a process for forming a fluorine-containing layer of a low dielectric constant film according to one embodiment of the present disclosure.

Referring to FIGS. 1-4, FIG. 1 is a block diagram of a process for preparing a low dielectric constant film according to one embodiment of the present disclosure; FIG. 2 is a block diagram of a process for forming an anticorrosive layer of a low dielectric constant film according to one embodiment of the present disclosure; FIG. 3 is a block diagram of a process for forming a porous layer of a low dielectric constant film according to one embodiment of the present disclosure; and FIG. 4 is a block diagram of a process for forming a fluorine-containing layer of a low dielectric constant film according to one embodiment of the present disclosure. The low dielectric constant film is obtained in a plasma enhanced chemical vapor deposition reactor, by performing multiple times of PECVD process.

According to one embodiment of the present disclosure, a method of preparing a low dielectric constant film comprises steps of:

101. vapor depositing an anticorrosive layer on a surface of a substrate;
    102. vapor depositing a porous layer; and
    103: vapor depositing a fluorine-containing layer;
    wherein in the step 101, it is desirable to introduce a vinyl epoxy compound A and a vinyl organosilicon compound B to by vapor deposition form the anticorrosive layer, specifically, the process of forming the anticorrosive layer comprises steps of:
    1011: introducing an epoxy alkane compound A and a siloxane or silane compound B into a chamber of a reactor;
    1012: introducing an inert gas into the chamber of the reactor;
    1013: operating the substrate;
    1014: at a predetermined power, forming the anticorrosive layer on the substrate surface by deposition through reaction of the compound A and the compound B.

Prior to the step 101, the substrate may also be pretreated, such as by cleaning the substrate surface. Specifically, the pretreatment of the substrate comprises steps of:

1001: ultrasonic cleaning the substrate: putting the substrate into a container containing deionized water, ultrasonic cleaning for 10-30 minutes, then taking out and drying in a drying oven; and
    1002: washing the substrate surface with acetone: wiping the part surface three times with a clean gauze stained with acetone, then drying in a drying oven.

During cleaning, one or more of the above methods may be selected for pretreatment, and the present disclosure is not limited in this respect.

For example, the process of the step 101 may include: placing the substrate with a clean surface in the reaction chamber of the plasma enhanced chemical vapor deposition reactor, then continuously vacuumizing the reaction chamber to 10-200 mtorr, and introducing inert gas He, Ar or He and Ar mixed gas, opening a movement mechanism, moving the substrate in the reaction chamber, after the pressure and temperature reaching preset values, introducing vinyl epoxy compound A and vinyl organosilicon compound B, regulating plasma power to 30-500 W, adjusting the temperature of the chamber to 10-100° C., performing plasma enhanced chemical vapor deposition, after the reaction is completed, stopping introducing reactants, raising the pressure of the chamber to atmospheric pressure. The step 101 may also be referred to as an anticorrosive treatment step, which allows the low dielectric constant film to be more tightly bonded to the substrate, and to prevent corrosion of the substrate.

Notably, according to embodiments of the present disclosure, in the forming process of the low dielectric constant film, a dynamic coating method is adopted, so that the low dielectric constant film is more uniformly adhered to the substrate, the difference of coating films on different positions of the substrate is reduced, the problem of non-uniform thickness caused by different concentrations of deposition in different regions of the substrate is solved. For example, as in the step 1013, the substrate moves in the reaction chamber, so that the anticorrosive layer is uniformly attached to different positions of the substrate. The operation modes of the substrate could comprise a plurality of modes, such as, the substrate may revolve about a central point of the reaction chamber as a reference point or a predetermined axis, rotate about the central axis of the substrate or a predetermined axis, or, rotate about transverse and longitudinal axes, respectively.

It is desirable in the step 102 to form the porous layer by vapor deposition of an organosilane and/or organosiloxane compound C and an alkane compound and/or benzene compound E.

Notably, in one embodiment, the step 102 is performed after the step 101, i.e., after the anticorrosive layer is formed, the porous layer is formed on the anticorrosive layer. However, in another embodiment, the step 102 may also be performed directly, i.e., the porous layer is formed directly on the surface of the substrate without firstly forming the anticorrosive layer. Specifically, the forming process of the porous layer comprises steps of:

1021: introducing an organosilane and/or organosiloxane compound C and an alkane compound and/or benzene compound E;

1022: introducing a gaseous nitrogen/hydrogen and/or ammonia;

1023: intermittently introducing oxygen; and

1024: at a predetermined power, forming the porous layer by vapor deposition through reaction of the organosilane and/or organosiloxane compound C and the alkane compound and/or benzene compound E.

For example, in the step 102 the forming process of the porous layer may include: after anticorrosion treatment, while continuing to introduce the compound C and the compound E, introducing nitrogen/hydrogen and/or ammonia, and also introducing gaseous oxygen intermittently, at a frequency of 10-600 seconds, i.e., oxygen being introduced every 10-600 seconds, the oxygen reaction time being 10-600 seconds, after the reaction being finished, the introduction of compound C and compound E being stopped, i.e., the porous layer being formed.

It should be noted that, in the step 102 the step 1013 may also be included, i.e., allowing the substrate to move continuously in the reaction chamber, i.e., forming the porous layer under dynamic conditions.

Notably, the reactive gas nitrogen/hydrogen and/or ammonia is added for depositing an nitrogen-containing nanometer coating. The nitrogen content of the nanometer coating is determined by the nitrogen content of the mixed monomer and the mixed gas of the nitrogen/hydrogen and/or ammonia. The flow rate of $O_2$ is one of the factors affecting the oxygen content of the nanometer coating.

When the low dielectric constant film is formed, alternately depositing an organosilicon nanometer film and the organosilicon/oxygen, oxygen is intermittently introduced after the organosilicon layer is formed, the hydrocarbon part of the organosilicon layer reacts with the oxygen to form an irregular rough surface, and then SiOCNH is deposited on the surface, so that macropores with relatively high specific surface area are facilitated to be formed, and the alternating structure facilitates the enhancement of the adhesive force of the low-dielectric constant film and the substrate.

In the step 103, the fluorine-containing layer is formed by vapor deposition of an aromatic fluorosilane D. Specifically, the fluorine-containing layer formation process of the step 103 comprises steps of:

1031: introducing an inert gas;

1032: introducing an aromatic fluorosilane D; and

1033: at a predetermined power, forming the fluorine-containing layer by vapor deposition through reaction of the aromatic fluorosilane D.

For example, in the step 103 the forming process of the fluorine-containing layer may include: after the porous layer is formed, introducing an inert gas, stopping introducing nitrogen/hydrogen and/or ammonia, furthermore, introducing a compound D, adjusting the plasma power to 30-150 W, continuing the plasma polymerization reaction, after vapor deposition for 10-60 min taking out the sample, and obtaining a desired multifunctional nanometer coating, namely the low dielectric constant film.

Notably, the step 103 follows the step 102, i.e., the fluorine-containing layer is formed after the porous layer is formed, or, the fluorine-containing layer is attached to the surface of the porous layer, thereby greatly enhancing the hydrophobicity of the low dielectric constant film.

It should be noted that, in the step 103 the step 1013 may also be included, i.e., operating the substrate to move continuously in the reaction chamber, i.e., forming the fluorine-containing layer under dynamic conditions.

Following the step 103, a high temperature annealing step may also be included. It is noted that in embodiments of the present disclosure, the pore structure is formed without the aid of a pore-forming agent, such as norbornadiene or α-terpineene, and the like, so that later removal of the pore-forming agent is not required and a high temperature annealing process is not necessary.

Furthermore, in some embodiments of the present disclosure, the volume of the reaction chamber or the coating chamber is 10 L-2000 L, according to the coating requirements and the volume of the coating chamber, processing parameters could be adjusted. The power range of the plasma coating is 0.01 W-500 W, the coating time is 30 s-7200 s, the gasification temperature is 30° C.-100° C., the chamber temperature is 20° C.-100° C., the flow rates of monomers are respectively selected as 0-1000 sccm. Oxygen and/or $N_2/H_2$, $NH_3$, hydrocarbon organic matter may be set to have a flow rate of 1-200 sccm, the selectable introducing frequency range is once per 10 s-500 s.

Specific examples are illustrated below.

Example 1

A clean PCB was taken, and placed in a plasma enhanced chemical vapor deposition reactor or a fixture of plasma coating equipment. Parameters were set according to the program, wherein the power was 100 W, the coating time was 1800 s, the gasification temperature was 95° C., the chamber temperature was room temperature, it was in the He atmosphere, the flow rate of He was 10 ssccm. Reaction gases A and B were respectively vinyl ethylene oxide and trimethyl vinyl silane, and were introduced at flow rates respectively of 100 sccm and 100 sccm. After the bottom layer deposition was completed, the introduction of monomers vinyl ethylene oxide and trimethyl vinyl silane was stopped, He was continuously introduced, and $N_2$ was also introduced. $N_2$ had a flow rate of 5 sccm. Reactants C and E were respectively hexamethyldisiloxane and monomer cyclohexane, and introduced at flow rates respectively of 100 sccm and 100 sccm. $O_2$ was intermittently fed with a frequency of once per 300 seconds. The power was changed to 50 W, the coating time was 3600 s, the gasification temperature was 110° C., the chamber temperature was 25° C., and the flow rate of $O_2$ was 10 sccm. After the coating time passed, $O_2$, $N_2$ were turned off. Reactant D perfluorooctyl dichlorophenyl silane was introduced, keeping other parameters unchanged.

Example 2

A clean PCB was taken, and placed in a fixture of plasma coating equipment.

Parameters were set according to the program, wherein the power was 100 W, the coating time was 1800 s, the gasification temperature was 95° C., the chamber temperature was room temperature, it was in the He atmosphere, the flow rate of He was 10 ssccm. Reactants A and B were respectively vinyl ethylene oxide and trimethoxy vinyl silane, and were introduced at flow rates respectively of 100 sccm and 100 sccm. After the bottom layer deposition was completed, the introduction of reactants vinyl ethylene oxide and trimethyl vinyl silane was stopped, He was continuously introduced, and $N_2$ was also introduced. $N_2$ had a flow rate of 5 sccm. Reactants C and E were respectively tris-(trimethoxysilane)ylphenylsilane and cyclobutane, and introduced at flow rates respectively of 100 sccm and 100 sccm. $O_2$ was intermittently fed with a frequency of once per 300 seconds. The power was changed to 50 W, the coating time was 3600 s, the gasification temperature was 110° C., the chamber temperature was 25° C., the flow rate of $O_2$ was 10 sccm. After the coating time passed, $O_2$, $N_2$ were turned off. Reactant D perfluorooctyl diethoxy phenyl silane was introduced, keeping other parameters unchanged. After coating, the gas pressure was raised to the normal pressure. The sample was taken out to obtain the low dielectric constant nanometer coating with porous structure of the present disclosure.

Example 3

A clean PCB was taken, and placed in a fixture of plasma coating equipment. Parameters were set according to the program, wherein the power was 100 W, the coating time was 1800 s, the gasification temperature was 95° C., the chamber temperature was room temperature, it was in the He atmosphere, the flow rate of He was 10 ssccm. Reactants A and B were respectively allyl glycidyl ether and trimethyl vinyl silane, and were introduced at flow rates respectively of 100 sccm and 100 sccm. After the bottom layer deposition was completed, the introduction of reactants allyl glycidyl ether and trimethyl vinyl silane was stopped. Continued to introduce He, and $NH_3$ was also introduced. $NH_3$ had a flow rate of 100 sccm. Reactants C and E were respectively tris-(triethoxysilane)yl phenylsilane and toluene, and introduced at flow rates respectively of 100 sccm and 100 sccm. $O_2$ was intermittently fed with a frequency of once per 150 seconds. The power was changed to 50 W, the coating time was 3600 s, the gasification temperature was 110° C., the chamber temperature was 25° C. After the coating time passed, $O_2$ and $NH_3$ were turned off. Reactant D perfluorooctyl ethyl pentafluorophenyl dichlorosilane was introduced. The power was changed to 50 W, the coating time was changed to 1800 s. The pressure was 100 mTorr. The gasification temperature was 110° C., the chamber temperature was 30° C. The flow rate of $O_2$ was 50 sccm. After coating, the gas pressure was raised to the normal pressure. The sample was taken out to obtain the low dielectric constant nanometer coating with porous structure of the present disclosure.

Example 4

A clean PCB was taken, and placed in a fixture of plasma coating equipment. Parameters were set according to the program, wherein the power was 100 W, the coating time was 1800 s, the pressure was 80 mTorr, the gasification temperature was 95° C., the chamber temperature was room temperature, it was in the Ar atmosphere, the flow rate of Ade was 10 ssccm. Reactants A and B were respectively 2,3-epoxypropyldimethylvinylsilane and dimethylmethoxyvinylsilane, and were introduced at flow rates respectively of 80 sccm and 120 sccm. After the bottom layer deposition was completed, the introduction of reactants 2,3-epoxypropyldimethylvinylsilane and dimethylmethoxyvinylsilane was stopped. Continued to introduce Ar and Reactants C and E were introduced. Reactants C and E were respectively tris-(triethylsilane)ylphenylsilane and cyclohexane, and were introduced at flow rates respectively of 20 sccm and 180 sccm. $O_2$ was intermittently fed with a frequency of once per 150 seconds. The power was changed to 50 W, the coating time was 3600 s, the gasification temperature was 110° C., the chamber temperature was 25° C. The flow rate of $O_2$ was 30 sccm. After the coating time passed, $O_2$ was turned off. Reactant D perfluorooctyl ethyl pentafluorophenyl dimethoxy silane was introduced. The power was changed to 50 W, the coating time was changed to 1800 s. The pressure was 120 mTorr. The gasification temperature was 110° C., the chamber temperature was 30° C. After coating, the gas pressure was raised to the normal pressure. The sample was taken out to obtain the low dielectric constant nanometer coating with porous structure of the present disclosure.

Example 5

A clean PCB was taken, and placed in a fixture of plasma coating equipment. Parameters were set according to the program, wherein the power was 80 W, the coating time was 3600 s, the pressure was 80 mTorr, the gasification temperature was 95° C., the chamber temperature was room temperature, it was in the Ar atmosphere, the flow rate of Ar was 20 ssccm. Reactants A and B were respectively 2,3-epoxypropyldimethylvinylsilane and trimethyl vinyl silane, and were introduced at flow rates respectively of 80 sccm and 120 sccm. After the bottom layer deposition was completed, the introduction of reactants 2,3-epoxypropyldimethylvinylsilane and trimethyl vinyl silane was stopped. Continued to introduce Ar, and $N_2$ and $H_2$ were also introduced at flow rates of 30 sccm and 90 sccm, respectively. Reactants C and E were respectively tris-(triethylsilane) ylphenylsilane and p-xylene, and introduced at flow rates respectively of 20 sccm and 180 sccm. $O_2$ was intermittently fed with a frequency of once per 120 seconds. The power was changed to 90 W, the coating time was 3600 s, the gasification temperature was 110° C., the chamber temperature was 50° C. The flow rate of $O_2$ was 80 sccm. After the coating time passed, $O_2$, $N_2$ and $H_2$ were turned off. Reactant D perfluorooctyl ethyl pentafluorophenyl dimethoxy silane was introduced. The power was changed to 80 W, the coating time was changed to 1800 s. The pressure was 120 mTorr. The gasification temperature was 110° C., the chamber temperature was 30° C. After coating, the gas pressure was raised to the normal pressure. The sample was taken out to obtain the low dielectric constant nanometer coating with porous structure of the present disclosure.

Example 6

A clean PCB was taken, and placed in a fixture of plasma coating equipment. Parameters were set according to the program, wherein the power was 80 W, the coating time was 3600 s, the pressure was 80 mTorr, the gasification temperature was 95° C., the chamber temperature was room temperature, it was in the Ar atmosphere, the flow rate of Ar was 20 ssccm. Reactants A and B were respectively 2,3-epoxypropyldimethylvinylsilane and 4-styryltrimethoxysilane, and were introduced at flow rates respectively of 80 sccm and 120 sccm. After the bottom layer deposition was completed, the introduction of reactants 2,3-epoxypropyldimethylvinylsilane and 4-styryltrimethoxysilane was stopped. Continued to introduce Ar, and $N_2$ and $H_2$ were also introduced at flow rates of 30 sccm and 90 sccm, respectively. Reactants C and E were respectively tris-(triethylsilane)ylphenylsilane and cyclopentane, and introduced at flow rates respectively of 20 sccm and 180 sccm. $O_2$ was intermittently fed with a frequency of once per 100 seconds. The power was changed to 90 W, the coating time was 3600 s, the gasification temperature was 110° C., the chamber temperature was 50° C. The flow rate of $O_2$ was 20 sccm. After the coating time passed, $O_2$, $N_2$ and $H_2$ were turned off. Reactant D perfluorobutyl ethyl pentafluorophenyl dichlorosilane was introduced. The power was changed to 80 W, and the coating time was changed to 1800 s. The pressure was 120 mTorr. The gasification temperature was 110° C., the chamber temperature was 30° C. After coating, the gas pressure was raised to the normal pressure. The sample was taken out to obtain the low dielectric constant nanometer coating with porous structure of the present disclosure.

Example 7

A clean PCB was taken, and placed in a fixture of plasma coating equipment. Parameters were set according to the program, wherein the power was 80 W, the coating time was 3600 s, the pressure was 80 mTorr, the gasification temperature was 95° C., the chamber temperature was room temperature, it was in the Ar atmosphere, and the flow rate of Ar was 20 ssccm. Reactants A and B were respectively 2,3-epoxypropyl dichloroethylene silane and tetramethyl tetravinyl cyclotetrasiloxane, and were introduced at flow rates respectively of 150 sccm and 50 sccm. After the bottom layer deposition was completed, the introduction of reactants 2,3-epoxypropyl dichloroethylene silane and tetramethyl tetravinyl cyclotetrasiloxane was stopped. Continued to introduce Ar, and $N_2$ and $H_2$ were also introduced at flow rates of 30 sccm and 90 sccm, respectively. Reactants C and E were respectively trifluoropropyl methyl cyclotrisiloxane and benzene, were introduced at flow rates respectively of 50 sccm and 150 sccm. $O_2$ was intermittently fed with a frequency of once per 600 seconds. The power was changed to 90 W, the the coating time was 3600 s, the gasification temperature was 110° C., the chamber temperature was 50° C., the flow rate of $O_2$ was 60 sccm. After the coating time passed, $O_2$, $N_2$ and $H_2$ were turned off. Reactant D perfluorobutyl ethyl pentafluorophenyl dimethoxy silane was introduced. The power was changed to 80 W, the coating time was changed to 3600 s. The pressure was 100 mTorr. The gasification temperature was 110° C., the chamber temperature was 30° C. After coating, the gas pressure was raised to the normal pressure. The sample was taken out to obtain the low dielectric constant nanometer coating with porous structure of the present disclosure.

Example 8

A clean PCB was taken, and placed in a fixture of plasma coating equipment. Parameters were set according to the program, wherein the power was 80 W, the coating time was 3600 s, the pressure was 80 mTorr, the gasification temperature was 95° C., the chamber temperature was room temperature, it was in the Ar atmosphere, the flow rate of Ar was 20 ssccm. Reactants A and B were respectively 2,3-epoxypropyl dichloroethylene silane and tetramethyl tetravinyl cyclotetrasiloxane, and were introduced at flow rates respectively of 150 sccm and 50 sccm. After the bottom layer deposition was completed, the introduction of reactants 2,3-epoxypropyl dichloroethylene silane and tetramethyl tetravinyl cyclotetrasiloxane was stopped. Continued to introduce Ar, and $N_2$ and $H_2$ were also introduced at flow rates of 30 sccm and 90 sccm, respectively. Reactants C and E were respectively tris-(triethylsilane)ylphenylsilane and cyclohexane, and were introduced at flow rates respectively of 20 sccm and 180 sccm. $O_2$ was intermittently fed with a frequency of once per 180 seconds. The power was changed to 90 W, the coating time was 3600 s, the gasification temperature was 110° C., the chamber temperature was 50° C., the flow rate of $O_2$ was 30 sccm. After the coating time passed, $O_2$, $N_2$ and $H_2$ were turned off. Reactant D perfluorooctyl ethyl pentafluorophenyl dimethoxysilane was introduced. The power was changed to 80 W, the coating time was changed to 1800 s. The pressure was 120 mTorr. The gasification temperature was 110° C., the chamber temperature was 30° C. After coating, the gas pressure was raised to the normal pressure. The sample was taken out to obtain the low dielectric constant nanometer coating with porous structure of the present disclosure.

Example 9

A clean PCB was taken, and placed in a fixture of plasma coating equipment. Parameters were set according to the program, wherein the power was 80 W, the coating time was 3600 s, the pressure was 80 mTorr, the gasification temperature was 95° C., the chamber temperature was room temperature, it was in the Ar atmosphere, the flow rate of Ar was 20 ssccm. Reactants A and B were respectively 2,3-epoxypropyl dichloroethylene silane and tetramethyl tetravinyl cyclotetrasiloxane, and were introduced at flow rates respectively of 150 sccm and 50 sccm. After the bottom layer deposition was completed, the introduction of reactants 2,3-epoxypropyl dichloroethylene silane and tetramethyl tetravinyl cyclotetrasiloxane was stopped. Continued to introduce Ar and reachtants C and E were introduced. Reactants C and E were respectively hexamethyldisilazane and cyclopentane, and introduced at flow rates respectively of 50 sccm and 150 sccm. $O_2$ was intermittently fed with a frequency of once per 150 seconds. The power was changed to 90 W, the coating time was 3600 s, the flow rate of $O_2$ was 20 sccm, the gasification temperature was 110° C., the chamber temperature was 50° C. After the coating time passed, 02 was turned off. Reactant D perfluorooctyl ethyl pentafluorophenyl dimethoxysilane was introduced. The power was changed to 80 W, the coating time was changed to 1800 s. The pressure was 100 mTorr. The gasification temperature was 110° C., the chamber temperature was 30° C. After coating, the gas pressure was raised to the normal pressure. The sample was taken out to obtain the low dielectric constant nanometer coating with porous structure of the present disclosure.

Example 10

Compared with Example 9, the anticorrosive layer was not prepared. A clean PCB was taken, and placed in a fixture of plasma coating equipment. Ar was introduced, reactants C and E were hexamethyldisilazane and cyclopentane and were introduced directly, respectively at flow rates of 100 sccm and 150 sccm. $O_2$ was intermittently fed with a frequency of once per 150 seconds. The power was changed to 90 W, the coating time was 3600 s, the flow rate of $O_2$ was 20 sccm, the gasification temperature was 110° C., the chamber temperature was 50° C. After the coating time passed, $O_2$ was turned off. Reactant DE perfluorooctyl ethyl pentafluorophenyl dimethoxysilane was introduced. The power was changed to 80 W, the coating time was changed to 1800 s. The pressure was 100 mTorr. The gasification temperature was 110° C., the chamber temperature was 30° C. After coating, the gas pressure was raised to the normal pressure. The sample was taken out to obtain the low dielectric constant nanometer coating with porous structure of the present disclosure.

Further, parameters of the above-described embodiments were detected.

The thickness of the nanometer coating was detected using American Filmetrics F20-UV-film thickness measurer. The water contact angle of the nanometer coating was tested according to GB/T 30447-2013 standard.

The dielectric constant was measured by the recommended method for measuring permittivity and dielectric loss factor of electrical insulating material at power frequency, audio frequency and high frequency (including meter wave wavelength) according to GB/T 1409-2006.

Salt spray resistance test was conducted according to GB/T 2423.18-2000 electrical and electronic product environment test method.

The Young's modulus of the nanometer coating was determined according to the technical specification of the JB/T 12721-2016 solid material in-situ nanometer indentation/scratch tester.

Table: performance parameters of examples 1-10

TABLE I

| Examples | Thickness/ nm | Contact angle/° | Dielectric constant | Young's modulus/ GPa | Salt spray 96 hours |
|---|---|---|---|---|---|
| Example 1 | 362 | 124 | 2.08 | 12.98 | No corrosion |
| Example 2 | 465 | 115 | 2.03 | 23.56 | No corrosion |
| Example 3 | 730 | 121 | 2.13 | 26.91 | No corrosion |
| Example 4 | 692 | 136 | 2.26 | 29.35 | No corrosion |
| Example 5 | 537 | 140 | 2.39 | 32.61 | No corrosion |
| Example 6 | 582 | 134 | 2.15 | 35.72 | No corrosion |
| Example 7 | 538 | 141 | 2.27 | 27.83 | No corrosion |
| Example 8 | 628 | 134 | 2.51 | 31.62 | No corrosion |
| Example 9 | 617 | 150 | 2.60 | 33.86 | No corrosion |
| Example 10 | 315 | 126 | 2.05 | 10.17 | Corrosion spots appeared |

Those skilled in the art will appreciate that, the embodiments of the present disclosure shown in the foregoing description and the accompanying drawings are by way of example only and are not intended to limit the present disclosure. The object of the present disclosure has been completely and effectively realized. The functionality and structural principles of the present disclosure have been shown and illustrated in the embodiments, and embodiments of the disclosure may be varied or modified without departing from the principles described herein.

What is claimed is:

1. A low dielectric constant film, prepared through plasma enhanced chemical vapor deposition, and comprising an anticorrosive layer on a substrate surface, and a porous layer on the anticorrosive layer.

2. The low dielectric constant film according to claim 1, wherein the anticorrosive layer is formed of an epoxy compound A containing unsaturated double bonds and a compound B by plasma enhanced chemical vapor deposition on the substrate surface, wherein the compound B is one or more selected from a group consisting of siloxanes containing unsaturated double bonds and silanes containing unsaturated double bonds.

3. The low dielectric constant film according to claim 1, wherein the porous layer is formed of a compound C and a compound E by plasma enhanced chemical vapor deposition, the compound C comprising one or more selected from a group consisting of an organosilane and an organosiloxane, and the compound E being one or more selected from a group consisting of an alkane compound and a benzene compound.

4. The low dielectric constant film according to claim 1, wherein the porous layer is formed of a compound C and a compound E by plasma enhanced chemical vapor deposition, the compound C comprising an organosilicon compound, and the compound E comprising one or more of an alkane compound and a benzene compound.

5. The low dielectric constant film according to claim 1, comprising a fluorine-containing layer, the fluorine-containing layer being formed of an aromatic fluorosilane compound D by plasma enhanced chemical vapor deposition.

6. The low dielectric constant film according to claim 1, wherein the anticorrosive layer is formed of a vinyl epoxy compound and a vinyl organosilicon compound by plasma enhanced chemical vapor deposition on the substrate surface.

7. The low dielectric constant film according to claim 2, wherein the compound A comprises one or more selected from a group consisting of: vinyl ethylene oxide, glycidyl methacrylate, allyl glycidyl ether, 1,2-epoxy-4-vinylcyclohexane, 2,3-epoxypropyldimethylvinylsilane, and 2,3-epoxypropyldichlorovinylsilane.

8. The low dielectric constant film according to claim 2, wherein the compound B comprises one or more selected from a group consisting of: allyltrimethoxysilane, vinyltriethoxysilane, trimethylvinylsilane, 3-butenyltrimethylsilane, vinyltributylketoximesilane, tetramethyldivinyldisiloxane, tetramethyltetravinylcyclotetrasiloxane, 1,2,2-trifluorovinyltriphenylsilane, dimethylmethoxyvinylsilane, and 4-styryltrimethoxysilane.

9. The low dielectric constant film according to claim 4, wherein the compound C comprises one or more selected from a group consisting of: γ-glycidyloxypropyltrimethoxysilane, hexamethylcyclotrisiloxane, tris-(trimethoxysilane)ylphenylsilane, t-butyldimethylchlorosilane, phenylethynyltrimethylsilane, biphenylvinyltrimethylsilane, octaphenylcyclotetrasiloxane, triphenylhydroxysilane, trifluoropropylmethylcyclotrisiloxane, 2,2,4,4-tetramethyl-6,6,8,8-tetraphenylcyclotetrasiloxane, tetramethyltetravinylcyclotetrasiloxane, 3-glycidyletheroxypropyltriethoxysilane, tetramethyldivinyldisiloxane, tetraethyldisiloxane, hexamethyldisiloxane, phenyltris(trimethylsiloxy) silane, trimethylphenylsilane, hexamethyldisilazane, allyltriphenylsilane, phenyltrichlorosilane, phenyltrifluorosilane, phenyltriethoxysilane, phenyltrimethoxysilane, methylphenyldimethoxysilane, dimethoxymethylphenylsilane, 1,3-dichlorotetraphenyldisiloxane, phenylvinyltrimethylsilane, naphthylvinyltrimethylsilane, diphenyldihydroxysilane, octamethylcyclotetrasiloxane, hexaphenylcyclotrisiloxane, decamethylcyclopentasiloxane, phenyltrichlorosilane, methylphenyldichlorosilane, phenyldimethylchlorosilane, methylphenylcyclotrisiloxane, trimethoxymethylsilane, trifluoropropylmethylcyclotrisiloxane, tris-(triethoxysilane)ylphenylsilane, perfluorooctylethylpentafluorophenyldimethoxysilane, and tris-(triethylsilane) ylphenylsilane.

10. The low dielectric constant film according to claim 4, wherein the compound E comprises one or more selected from a group consisting of: cyclobutane, cyclopentane, cyclohexane, benzene, toluene, and p-xylene.

11. The low dielectric constant film according to claim 5, wherein the compound D comprises one or more selected from a group consisting of: pentafluorophenyltriethoxysilane, pentafluorophenyltrimethoxysilane, pentafluorophenyltrichlorosilane, pentafluorophenyldimethylchlorosilane, perfluorooctyl ethyl pentafluorophenyl dichlorosilane, pentafluorodichlorophenyl perfluorohexyl ethylsilane, perfluorooctyldichlorophenyl silane, perfluorooctyldiethoxyphenylsilane, perfluorooctylethylpentafluorophenyldimethoxysilane, perfluorobutylethylpentafluorophenyldichlorosilane, and perfluorobutylethylpentafluorophenyldimethoxysilane.

12. The low dielectric constant film according to claim 2, wherein an auxiliary gas is introduced for reaction during vapor deposition, the auxiliary gas comprising one or more selected from a group consisting of He and Ar.

13. The low dielectric constant film according to claim 4, wherein an auxiliary gas is introduced for reaction during vapor deposition, the auxiliary gas comprising one or more selected from a group consisting of nitrogen plus hydrogen, ammonia, oxygen, and hydrocarbon organic matter.

14. The low dielectric constant film according to claim 1, wherein a dielectric constant values of the low dielectric constant film ranges from 2.1 to 2.7.

15. The low dielectric constant film according to claim 1, wherein the low dielectric constant film has a Young's modulus ranging from 10 GPa to 13 GPa, from 23 GPa to 24 GPa, from 26 GPa to 28 GPa, from 29 GPa to 30 GPa, from 31 GPa to 32 GPa or from 33 GPa to 34 GPa.

16. The low dielectric constant film according to claim 1, wherein the low dielectric constant film has a static contact angle ranging from 110° to 155°.

17. The low dielectric constant film according to claim 1, wherein the low dielectric constant film has a thickness ranging from 10 nm to 2000 nm.

18. A low dielectric constant film, prepared through plasma enhanced chemical vapor deposition, and comprising a porous layer and a fluorine-containing layer, wherein the porous layer is deposited directly on a surface of a substrate, and the fluorine-containing layer is deposited on a surface of the porous layer, wherein the porous layer is formed of a compound C and a compound E by plasma enhanced chemical vapor deposition, the compound C comprising an organosilicon compound, and the compound E comprising one or more of an alkane compound and a benzene compound.

19. The low dielectric constant film according to claim 4, wherein the anticorrosive layer is formed of an epoxy compound A containing unsaturated double bonds and a compound B by plasma enhanced chemical vapor deposition, and the compound B comprising one or more selected from a group consisting of a siloxane with unsaturated double bonds and a silane compound with unsaturated double bonds.

20. A method for preparing the low dielectric constant film according to claim 1, comprising steps of:
   (A) vapor depositing the anticorrosive layer on the substrate surface; and
   (B) vapor depositing the porous layer.

21. The method according to claim 20, wherein the step (A) comprises:
   (A1) introducing an epoxy compound containing unsaturated double bonds and an organosilicon compound containing unsaturated double bonds into a chamber of a reactor;
   (A2) introducing an inert gas into the chamber of the reactor; and
   (A3) at a predetermined power, forming the anticorrosive layer on the substrate surface by deposition through reaction from the epoxy compound containing unsaturated double bonds and the organosilicon compound containing unsaturated double bonds.

22. The method according to claim 20, wherein the step (B) comprises:
   (B1) introducing a compound C and a compound E, wherein the compound C comprises an organosilicon compound, the compound E comprises one or more of an alkane compound and a benzene compound;
   (B2) introducing a gas, wherein the gas comprises one or more selected from a group consisting of a combination of nitrogen and hydrogen, and ammonia;
   (B3) introducing oxygen; and
   (B4) at a predetermined power, forming the porous layer by vapor deposition through reaction from the compound C and the compound E.

23. The method according to claim 22, wherein the compound C comprises one or more of an organosiloxane, an organosilane.

24. The method according to claim 22, wherein oxygen is introduced intermittently.

25. The method according to claim 20, comprising a step (C):
   vapor depositing a fluorine-containing layer onto the porous layer.

26. The method according to claim 25, wherein the step (C) comprises:

(C1) introducing an inert gas;

(C2) introducing an aromatic fluorosilane D; and (C3) at a predetermined power, forming the fluorine-containing layer by vapor deposition from reaction of the aromatic fluorosilane D.

27. The method according to claim 20, further comprising a step of: operating the substrate such that the substrate moves in a chamber.

28. The method according to claim 21, wherein the epoxy compound containing unsaturated double bonds comprises one or more selected from a group consisting of: vinyl ethylene oxide, glycidyl methacrylate, allyl glycidyl ether, 1,2-epoxy-4-vinylcyclohexane, 2,3-epoxypropyldimethylvinylsilane, and 2,3-epoxypropyldichlorovinylsilane.

29. The method according to claim 21, wherein the organosilicon compound containing unsaturated double bonds comprises one or more selected from a group consisting of: allyltrimethoxysilane, vinyltriethoxysilane, trimethylvinylsilane, 3-butenyltrimethyl silane, vinyltributyleketoxime silane, tetramethyldivinyldisiloxane, tetramethyltetravinylcyclotetrasiloxane, 1,2,2-trifluorovinyltriphenylsilane, dimethylmethoxyvinylsilane, and 4-styryltrimethoxysilane.

30. The method according to claim 22, wherein the compound C comprises one or more selected from a group consisting of: γ-glycidyloxypropyltrimethoxysilane, hexamethylcyclotrisiloxane, tris-(trimethoxysilane) ylphenylsilane, t-butyldimethylchlorosilane, phenylethynyltrimethylsilane, biphenylvinyltrimethylsilane, octaphenylcyclotetrasiloxane, triphenylhydroxysilane, trifluoropropylmethylcyclotrisiloxane, 2,2,4,4-tetramethyl-6,6,8,8-tetraphenylcyclotetrasiloxane, tetramethyltetravinylcyclotetrasiloxane, 3-glycidyl ether oxypropyltriethoxysilane, tetramethyldivinyldisiloxane, tetraethyldisiloxane, hexamethyldisiloxane, phenyltris (trimethylsiloxy) silane, trimethylphenylsilane, hexamethyldisilazane, allyltriphenylsilane, phenyltrichlorosilane, phenyltrifluorosilane, phenyltriethoxysilane, phenyltrimethoxysilane, methylphenyldimethoxysilane, dimethoxymethylphenylsilane, 1,3-dichlorotetraphenyldisiloxane, phenylvinyltrimethylsilane, naphthylvinyltrimethylsilane, diphenyldihydroxysilane, octamethylcyclotetrasiloxane, hexaphenylcyclotrisiloxane, decamethylcyclopentasiloxane, phenyltrichlorosilane, methylphenyldichlorosilane, phenyldimethylchlorosilane, methylphenylcyclotrisiloxane, trimethoxymethylsilane, trifluoropropylmethylcyclotrisiloxane, tris-(triethoxysilane) ylphenylsilane, perfluorooctylethylpentafluorophenyldimethoxysilane, and tris-(triethylsilane) ylphenylsilane.

31. The method according to claim 22, wherein the compound E comprises one or more selected from a group consisting of: cyclobutane, cyclopentane, cyclohexane, benzene, toluene, and p-xylene.

32. The method according to claim 26, wherein a compound D is introduced and the compound D comprises one or more selected from a group consisting of: pentafluorophenyltriethoxysilane, pentafluorophenyltrimethoxysilane, pentafluorophenyltrichlorosilane, pentafluorophenyldimethylchlorosilane, perfluorooctyl ethyl pentafluorophenyl dichlorosilane, pentafluorodichlorophenyl perfluorohexylethylsilane, perfluorooctyldichlorophenyl silane, perfluorooctyldiethoxyphenylsilane, perfluorooctylethylpentafluorophenyldimethoxysilane, perfluorobutylethylpentafluorophenyldichlorosilane, and perfluorobutylethylpentafluorophenyldimethoxysilane.

33. The method according to claim 20, wherein the low dielectric constant film has a dielectric constant value ranging from 2.1 to 2.7.

34. The method according to claim 20, wherein a Young's modulus of the low dielectric constant film ranges from 10 GPa to 13 GPa, from 23 GPa to 24 GPa, from 26 GPa to 28 GPa, from 29 GPa to 30 GPa, from 31 GPa to 32 GPa or from 33 GPa to 34 GPa.

35. The method according to claim 20, wherein a static contact angle of the low dielectric constant film ranges from 110° to 155°.

36. The method according to claim 20, wherein the low dielectric constant film has a thickness in a range of 10-2000 nm.

* * * * *